(12) United States Patent
Shimoda et al.

(10) Patent No.: US 6,639,250 B1
(45) Date of Patent: Oct. 28, 2003

(54) MULTIPLE-WAVELENGTH LIGHT EMITTING DEVICE AND ELECTRONIC APPARATUS

(75) Inventors: Tatsuya Shimoda, Suwa (JP); Tomoko Koyama, Suwa (JP); Takeo Kaneko, Suwa (JP); Jeremy Henry Burroughes, Cambridge (GB)

(73) Assignees: Seiko Epson Corporation, Tokyo (JP); Cambridge Display Technology, Ltd., Cambridge (GB)

(*) Notice: Subject to any disclaimer, the term of this patent is extended or adjusted under 35 U.S.C. 154(b) by 0 days.

(21) Appl. No.: 09/807,754
(22) PCT Filed: Aug. 14, 2000
(86) PCT No.: PCT/GB00/03121
§ 371 (c)(1), (2), (4) Date: Jun. 18, 2001
(87) PCT Pub. No.: WO01/15246
PCT Pub. Date: Mar. 1, 2001

(30) Foreign Application Priority Data

Aug. 20, 1999 (GB) .............................. 9919826

(51) Int. Cl.$^7$ .............................................. H01L 33/00
(52) U.S. Cl. ............................ 257/98; 257/89; 438/29; 438/35; 438/99
(58) Field of Search ....................... 257/89, 98; 438/29, 438/35, 99

(56) References Cited

U.S. PATENT DOCUMENTS

| | | | |
|---|---|---|---|
| 5,554,911 A | 9/1996 | Nakayama et al. | 313/504 |
| 5,920,080 A | 7/1999 | Jones | 257/40 |
| 5,949,187 A | 9/1999 | Xu et al. | 313/504 |
| 6,124,024 A * | 9/2000 | Hosokawa et al. | 257/98 |
| 6,236,061 B1 * | 5/2001 | Walpita | 257/40 |
| 6,274,979 B1 * | 8/2001 | Celii et al. | 313/498 |
| 2002/0003925 A1 * | 1/2002 | Little et al. | 385/37 |

FOREIGN PATENT DOCUMENTS

| | | |
|---|---|---|
| EP | 0 616 488 A2 | 9/1994 |
| EP | 0 683 623 A1 | 11/1995 |

(List continued on next page.)

OTHER PUBLICATIONS

Nakayama et al., "Organic Luminescent Devices with Optical Microcavity Structure" Technical Report of IEICE, OME 94–79 (1995–03), pp. 7–12.

(List continued on next page.)

Primary Examiner—Michael S. Lebentritt
Assistant Examiner—Christian D. Wilson
(74) Attorney, Agent, or Firm—Oliff & Berridge PLC

(57) ABSTRACT

An efficient multiple-wavelength light emitting device is provided. This multiple-wavelength light emitting device comprises a light emitting layer 4 for emitting light containing wavelength components to be output, a negative electrode 5 that is positioned at the back surface of the light emitting layer and that transmits at least a portion of the light, reflecting layers 7R, 7G, and 7B, positioned at the back surface of the negative electrode, for reflecting, of the light emitted through the negative electrode to the back surface, light having specific wavelengths, which reflecting layers are stacked up in order perpendicularly to the light axis, in correspondence with the wavelengths of the light to be reflected, thus configuring a reflecting layer group 7. In the direction perpendicular to the light axis, divisions are made in any of at least two or more light emission regions which reflect light of different wavelengths. In each light emission region, the distance between the reflecting surface of the reflecting layer 7 on the semi-transparent side and the reflecting surface in the semi-reflecting layer 2 is adjusted in this configuration so that it becomes a resonating optical path length for the light that is emitted in the light emission region.

20 Claims, 9 Drawing Sheets

FOREIGN PATENT DOCUMENTS

| | | | |
|---|---|---|---|
| EP | 0 687 019 | A1 | 12/1995 |
| JP | 59-194393 | A | 11/1984 |
| JP | 6-275381 | A | 9/1994 |
| JP | 7-320864 | A | 12/1995 |
| JP | 8-64862 | A | 3/1996 |
| JP | 8-248276 | A | 9/1996 |
| JP | 10-133222 | A | 5/1998 |
| JP | 10-163967 | A | 6/1998 |
| JP | 2797883 | B2 | 7/1998 |
| WO | WO 98/59528 | | 12/1998 |
| WO | WO 99/16039 | | 4/1999 |

OTHER PUBLICATIONS

Dodabalapur et al., "Physics and Applications of Organic Microcavity Light Emitting Diodes", J. Appl. Phys. 80 (12), Dec. 15, 1996, pp. 6954–6964.

Masenelli et al.; "Controlled Spontaneous Emission of a tri(8–hydroxyquinoline) Aluminum Layer in a Microcavity"; Journal of Applied Physics; vol. 85, No. 6; pp. 3032–3036.

"Vertical–Cavity Organic Light–Emitting Diode Display"; IBM Technical Disclosure Bulletin; vol. 40, No. 09.; Sep. 1997; pp. 165–167.

Fukuda et al.; "An Organic LED Display Exhibiting Pure RGB Colors"; Electroluminescenent of Molecular Materials; Sheffield, UK; May 1999; pp. 1–6.

L.J. Rothberg et al. "Resonant Cavity Organic Electroluminescent Devices"; AT&T Bell Laboratories.

Lidzey et al.; "Pixelated Multicolor Microcavity Displays"; IEEE Journal of Selected Topics in Quantum Electronics; vol. 4, No. 1; Jan./Feb. 1998; pp. 113–118.

* cited by examiner

LIGHT EMISSION REGION

LIGHT EMISSION REGION

PRIOR ART

MULTIPLE-WAVELENGTH LIGHT EMITTING DEVICE AND ELECTRONIC APPARATUS

FIELD OF THE INVENTION

This invention relates to light emitting devices capable of emitting light of a plurality of colors and suitable for use as organic electro-luminescence (EL) devices, and particularly to the improvement of reflecting layers therein.

DESCRIPTION OF THE RELATED ART

Art is known for combining reflecting layers with multi-layer dielectric films laminated in alternating layers having different refractive indexes and thereby reflecting light of specific wavelengths. In the Shingaku Giho OME 94-79 (March, 1995), pp 7–12, there is a discussion on how to emit multiple colors of light using a micro resonance structure based on such a multi-layer dielectric film. According to this literature, by adjusting the positions of the light emitting layers and the reflecting layers where reflection occurs in the micro resonance structure, it is possible to output resonant light of any wavelength contained in the light emitting layers.

In Japanese Patent Application Laid-Open No. H6-275381/1994 (gazette), for example, a light emitting device having the laminar structure diagrammed in FIG. 9 is set forth. This light emitting device comprises a transparent substrate 100, a micro resonance structure 102, a positive electrode 103, a hole transport layer 104, an organic electro-luminescence (EL) layer 105, and a negative electrode 106. Of these, the thickness of the positive electrode 103 is varied respectively to select the wavelength of the light that resonates. Aluminum or alkali metals are used as the material for the negative electrode.

In a conventional electro-luminescence device, the negative electrode is ideally designed so that it completely reflects light. In actual practice, the negative electrode has been designed at times so that it is made as thin as possible to make the relative drive resistance of the EL-layer smaller.

When the negative electrode is formed thinly, however, the reflectance thereof is not always sufficient, whereupon some of the light leaks out to the back side of the electro-luminescence device without being reflected. Light utilization has thus been rather low compared to the ideal reflecting layer where complete reflection is assumed. When a mirror formed by a micro resonance structure such as cited in Japanese Patent Application No. H6-275381/1994 is positioned on the front surface (light output side) of the EL layer and wavelength selectivity thereby raised, the amount of light returning to the light emitting layer side from this mirror is increased. In a conventional device having such a structure as this, the reflectance of the negative electrode at the back surface of the EL layer is low, wherefore the light utilization factor declines significantly, which is a problem.

If only light reflecting efficiency is to be considered, there are materials known which exhibit high reflectance. However, there are restrictions on the materials which can be used for the negative electrode in an electro-luminescence device, such as energy level, and it has not been possible to use negative electrodes of high reflectance in conventional devices.

Returning the light that leaks out with a reflecting mirror is conceivable, but no suitable reflecting mirror has been devised that is suitable for a thin-film device.

SUMMARY OF THE INVENTION

A first object of the present invention is to provide a multiple-wavelength light emitting device that can emit light in a plurality of wavelengths with higher efficiency than conventionally.

A second object of the present invention is to provide a multiple-wavelength light emitting device that has higher efficiency than conventionally for multiple wavelengths and that has a simpler structure.

A third object of the present invention is to provide an electronic apparatus that can emit light in a plurality of wavelengths with higher efficiency than conventionally.

The present invention is a multiple-wavelength light emitting device for emitting light in a plurality of different wavelengths, comprising:

(1) light emission means for emitting light containing wavelength components to be output, (2) a semi-transparent layer that transmits at least a portion of the light, placed at the back surface of the light emission means, (3) a reflecting layer group provided on a first surface side of the light emission means, with the semi-transparent layer intervening, wherein reflecting layers that reflect light having specific wavelengths of the light ejected to (or transmitted towards) the first surface side from the light emission means via the semi-transparent layer are laminated in order in the direction of the light axis, which is in the direction of light advance, in correspondence with wavelengths of light to be output, and (4) a semi-reflecting layer group provided on a second surface side in opposition to the first surface of the light emission means, wherein semi-reflecting layers that reflect a portion of light having specific wavelengths of the light ejected to the second surface side from the light emission means and transmit the remainder thereof are laminated in order in the direction of the light axis, which is in the direction of light advance, in correspondence with the wavelengths of light to be output.

In two or more light emission regions wherein the output light wavelength differs, the distance between the reflecting surface for light from the light emission means in a reflecting layer in the reflecting layer group that reflects light of the wavelength output in that light emission region and the reflecting surface for light from the light emission means in a semi-reflecting reflecting layer in the semi-reflecting layer group that reflects a portion of light of the wavelength output in that light emission region is adjusted so that it becomes a resonating optical path length for light ejected from that light emission region.

As based on the configuration described in the foregoing, the light that is ejected to the second surface (back surface) from the light emission means and passes through the semi-transparent layer to leak out is reflected by the action of the reflecting layer group, again passes through the semi-transparent layer, and is ejected to the first surface (front surface) side of the light emitting device. By adjusting the distance between the semi-reflecting layer and the reflecting layer, the wavelength of the light output from that light emission region is determined. In that light emission region, other reflecting layers that are optimized for light having wavelengths other than the wavelength of the light output do no more than act equally in every light emission region as semi-transparent layers simply having a constant attenuation factor, wherefore it is possible to maintain light volume balance between light of multiple wavelengths.

The terms employed in this patent application are now defined. The term "light emission means" is not limiting, but it is at least necessary that wavelength components for the light that is to be output be contained. It is desirable that the "reflecting layers" form a flat plane, but it does not necessarily have to be a uniform plane. By "light emission region" is meant a region for outputting light having some wavelength dispersion, meaning that light is output in wavelengths that differ for each light emission region. The "wavelengths" include not only wavelengths in the so-called visible light region but all wavelengths of a wider range including ultraviolet and infrared radiation. "Reflecting layers" include such structures as simple completely reflecting mirrors, half mirrors, and polarizing panels in addition to interference-causing laminar structures wherein multiple layers of film having different refractive indexes are laminated. "Semi-reflecting layers" include structures such as half mirrors and polarizing panels in addition to interference-causing laminar structures wherein multiple layers of film having different refractive indexes are laminated. By "optical path length" is meant a distance corresponding to the product of the refractive index and thickness of a medium.

The thickness of the semi-transparent layers described in the foregoing is adjusted so that the phase of the light that, after being reflected by the reflecting layer group, again passes through that semi-transparent layer and is ejected to (or transmitted towards) the second surface side of the light emission means coincides with the phase of the light that is directly ejected to the second surface side of the light emission means.

It is here desirable that an adjustment be made so that the following relationship is satisfied.

$$\Sigma(ni \cdot di) = m \cdot \lambda/2$$

where, in a light emission region wherein light of wavelength $\lambda$ is ejected, ni is the refractive index in each layer that exists between the point of light emission in the light emission means and the light reflecting surface of the light reflecting layer for light of wavelength $\lambda$ in the light reflecting layer group, di is the thickness thereof, and m is a natural number.

In the present invention, for example, a gap adjusting layer is provided between the semi-transparent layer and the reflecting layer group for adjusting the distance between the reflecting surface for the light from the light emission means in the light reflecting layer and the reflecting surface for the light from the light emission means in the semi-reflecting layer.

The reflecting layer group described in the foregoing is configured, for example, with multiple types of reflecting layer corresponding to the wavelengths of multiple kinds of light of different wavelength separated between the light emission regions.

Specifically, the reflecting surfaces for light from the light emission means in the reflecting layers in the reflecting layer group are located at different positions in the thickness dimension for each light emission region.

Specifically, in a light emission region where light of wavelength $\lambda$ is ejected, the distance L between a reflecting surface for light from the light emission means in the reflecting layer and the reflecting surface for light from the light emission means in the semi-reflecting layer is adjusted so that the following relationships are satisfied.

$$L = \Sigma di$$

$$\Sigma(ni \cdot di) = m \cdot \lambda/2$$

where ni is the refractive index of the i'th substance between these reflecting surfaces, di is the thickness thereof, and m is a natural number.

It is preferable that, in the reflecting layer group described above, reflecting layers reflecting light of longer wavelength are placed on the light emission means side.

When reflecting layers are configured with multi-layer dielectric films, the reflective layers making up the reflecting layer group noted above are configured so that two layers of different refractive index are alternately stacked up.

The reflecting layers are adjusted so that the following relationship is satisfied.

$$n1 \cdot d1 \approx n2 \cdot d2 \approx (\tfrac{1}{4} + m/2) \cdot \lambda$$

where n1 is the refractive index of one layer of the two layers having differing refractive indexes, d1 is the thickness thereof, n2 is the refractive index of the other layer, d2 is the thickness thereof, $\lambda$ is the wavelength of light reflected in the reflecting layer thereof, and m is 0 or a natural number.

The surfaces on the reflecting layer group side of the semi-transparent layers noted above are formed so that they are in the same plane in all light emission regions.

In the reflecting layer group noted above, for example, multiple types of reflecting layers corresponding to the wavelengths of light of multiple different wavelengths may be laminated uniformly without being separated between light emission regions.

In the reflecting layer group noted in the foregoing, for example, spacers are provided between the reflecting layers for adjusting the optical path length between the reflecting surface for light from the light emission means in the reflecting layer and the reflecting surface for light from the light emission means in the semi-reflecting layer.

In the reflecting layer group noted above, for example, in order to adjust the optical path length from the reflecting surface for light from the light emission means in the reflecting layers noted above to the reflecting surface for the light on the light emission means side in the semi-reflecting layers noted above, the thickness of any one layer in the laminar structure of layers having different refractive indexes configuring those reflecting layers is altered.

As one example, there are cases where a plurality of types of light emission means for emitting relatively light having a plurality of wavelengths associated with the light emission regions noted above is provided so as to correspond with those light emission regions.

As another example, there are cases where light emission means capable of emitting light having wavelength components associated with all of the light emission regions noted in the foregoing is provided in common in those light emission regions.

In one specific configuration the light emission means noted above is an organic electro-luminescence layer sandwiched between electrodes, with the electrode provided at the first surface thereof being made the semi-transparent layer noted above.

These light emission means may be provided with an electron transport layer and/or a hole transport layer.

The present invention is a multiple-wavelength light emitting device for emitting a plurality of light types having different wavelengths, comprising an organic electro-luminescence layer for emitting light containing the wavelength components to be output, and an electrode for reflecting the light ejected to (or transmitted towards) the first surface of that organic electro-luminescence layer, positioned at the first surface of the organic electro-luminescence layer. The present invention is also a multiple-wavelength light emitting device that is characterized in that the electrode is configured of one substance selected from a group made up of diamond, boron nitride, or aluminum nitride.

The present invention is an electronic apparatus comprising the multiple-wavelength light emitting device of the present invention described above.

DESCRIPTION OF THE PREFERRED EMBODIMENTS

Preferred embodiments of the present invention are now described while referencing the drawings.

Embodiment 1

Figure 1:
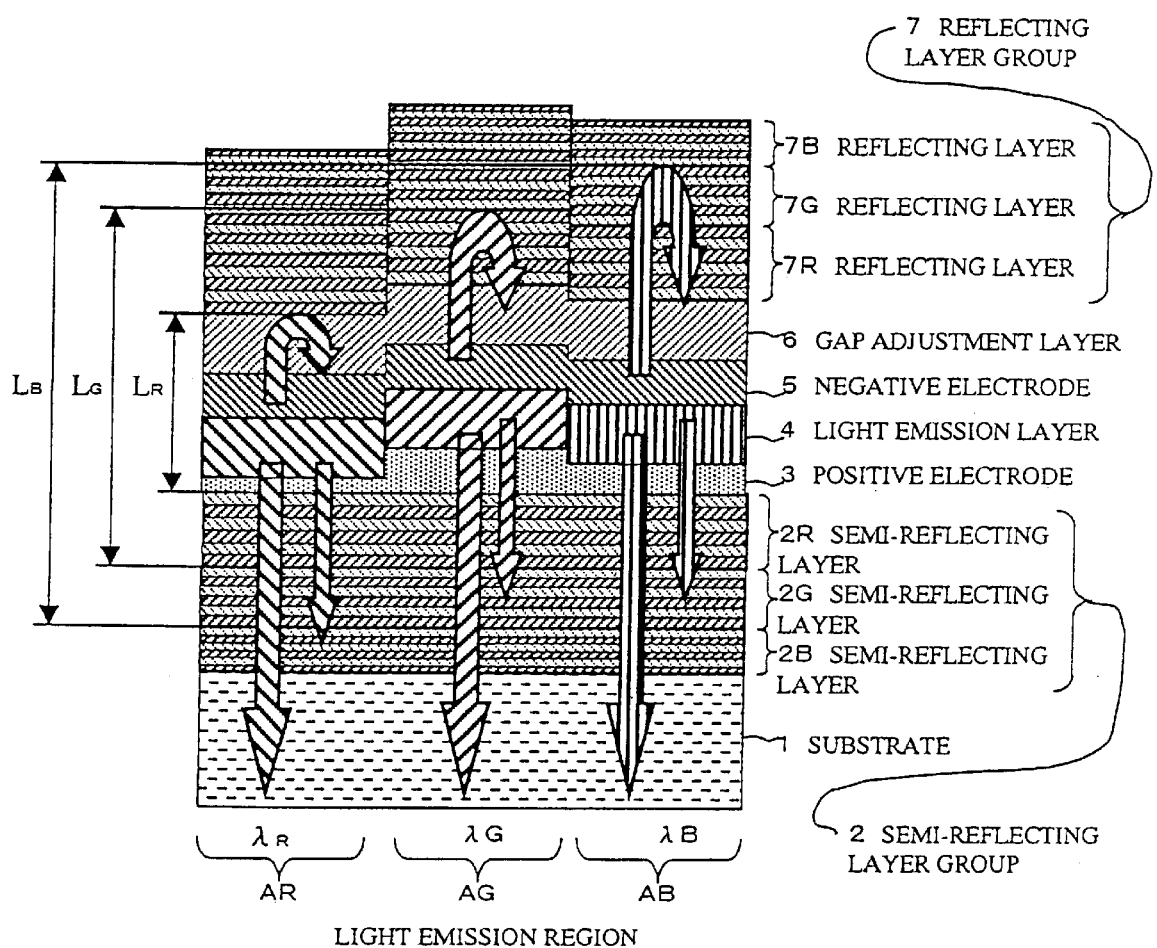
FIG. 1 is a cross-sectional diagram of the layer structure in a multiple-wavelength light emitting device in a first embodiment of the present invention.

A first embodiment of the present invention relates to a basic structure for a high-efficiency multiple-wavelength light emitting device capable of emitting three primary colors as necessary for color displays, and capable of returning light that leaks out to the back surface to the front surface. In FIG. 1 is diagrammed the layer structure of the multiple-wavelength light emitting device in the first embodiment. The lower side in the drawing is the side (front surface) on which is ejected light for the second surface of the light emitting device, while the upper side in the drawing is the side (back surface) on which light is ejected for the first surface of the light emitting device.

This multiple-wavelength light emitting device comprises a substrate 1, a semi-reflecting layer group 2, a positive electrode 3, a light emitting layer 4, a negative electrode 5, a gap adjustment layer 6, and a reflecting layer group 7. The layer structure in the present invention pertains to the light emitting layer 4, the negative electrode 5, the gap adjustment layer 6, and the reflecting layer group 7. The configuration of the front surface side of the light emission layer 4 is only given as an example and may comprise another structure.

This multiple-wavelength light emitting device is divided into two or more light emission regions where light of different wavelengths is reflected in the dimension perpendicular to the light axis. In this embodiment, where it is assumed that the primary colors are red (R), green (G), and blue (B), three light emission regions are comprised, namely light emission region $A_R$ which reflects and ejects red and transmits light of wavelength $\lambda_R$, light emission region $A_G$ which reflects and ejects green light of wavelength $\lambda_G$, and light emission region $A_B$ which reflects and ejects blue light of wavelength $\lambda_B$.

Light emission layers 4R, 4G, and 4B are light emission means for emitting light containing the wavelength components to be output, formed respectively of an organic EL material. The organic EL material used for each emits a relatively large amount of light containing light components of a wavelength associated with one of the light emission regions. Any of the materials researched and developed as an organic electro-luminescence device material can be used appropriately for the materials in these light emitting layers, such as those, for example, cited in Japanese Patent Application Laid-Open No. H10-163967/1998 or Japanese Patent Application Laid-Open No. H8-248276/1996. More specifically, the material for the red light emitting layer 4R may be a cyano-polyphenylene vinylene precursor, 2-1,3', 4'-dihydroxy-phenyl-3,5,7-trihydroxy-1-benzo-polybarium perchlorate,- or PVK, doped with DCM1. The material for the green light emitting layer 4G may be a polyphenylene vinylene precursor, 2,3,6,7-tetrahydro-11-oxo-1H,5H,11H-(1) benzopyrano[6,7,8-ink jet recording head]-quinolidine-10-carbolic acid, or PVK, doped with quotamine 6. And the material for the blue light emitting layer 4B may be an aluminum quinolinol complex, pyrazoline dimer, 2,3,6,7-tetrahydro-9-methyl-11-oxo-1H,5H,11H-(1)benzopyrano[6, 7,8-ink jet recording head]-quinolidine, distilled derivative, or PVK doped with 1,1,4,4-triphenyl-1,3-butadiene.

Whether the light emisssion point lies at the center position of the light emission layer changes depending on whether or not an electric transport layer is present. The thickness of each light emitting layer is determined according to the relationship between the light emission wavelength and the negative electrode that forms the reflecting surface.

The negative electrode 5 is positioned at the back surface of the light emitting layer and functions as a semi-transparent layer to transmit at least a portion of the light. In order to cause this to function as the negative electrode in an organic EL device, either a metal, alloy, or electrically conductive compound having a small work function (4 eV or lower), or a mixture thereof, is used. The configuration in this embodiment, in particular, makes it possible for light leaking out to the back surface to be returned by a reflecting layer, wherefore there is no need to consider light reflectance. Specific examples of negative electrode materials include sodium, sodium-potassium alloys, magnesium, lithium, magnesium/copper mixtures, magnesium/silver mixtures, magnesium/aluminum mixtures, magnesium/indium mixtures, aluminum/aluminum oxide mixtures, indium, lithium/aluminum mixtures, rare earth metals or halides. The negative electrode 5, as a semi-transparent layer, may be a single layer or a laminar structure made up of a plurality of layers.

It is desirable that the thickness of the negative electrode 5 described in the foregoing be adjusted so that the phase of the light that is reflected by the reflecting layer group 7, that passes again through the semi-transparent layer, and that is ejected to the front surface of the light emitting layer 4 be made to coincide with the phase of the light that is directly ejected to the front surface of that light emitting layer 4. This adjustment is made, for example, so that, in a light emission region that causes light of wavelength λ to be ejected, the following relationship is satisfied.

$$\Sigma(n_i \cdot d_i) = m \cdot \lambda/2 \qquad \text{Eq. 1}$$

where ni is the refractive index, respectively, of each layer (or of each layer substance in cases where the negative electrode comprises a plurality of layers) present between the light emission point in the light emission means described earlier and the reflecting surface in the reflecting layer for light of wavelength λ in the reflecting layer group described earlier, di is the thickness thereof, respectively, and m is a natural number. It is preferable, however, that the relationship in Equation 1 above be satisfied also in cases where ni is the refractive index, respectively, of each layer existing between the light emission point in the light emission means and the reflecting surface for light of wavelength λ, di is the thickness thereof, respectively, and m is a natural number.

The gap adjustment layer 6 is a layer provided for adjusting the optical path length for the reflected light. It may be of any material so long as it transmits light. For the material of the gap adjustment layer 6, it is possible to use a light-transmissive organic substance or an inorganic substance such as $SiO_2$, $Si_3N_4$, $TiO_2$, or some other dielectric.

The thickness of the gap adjustment layer 6 is adjusted so that, in each light emission region, the distance between the reflecting surface on the light emitting layer side of the reflecting layer and the reflecting surface on the light emitting layer side of the semi-reflecting layer becomes an optical path length ($L_R$, $L_G$, $L_B$) wherein light reflected in each light emission region resonates.

It is desirable that the distance L between the reflecting surface on the negative electrode 5 side of the reflecting layer 7 that reflects light of wavelength λ and the reflecting surface on the negative electrode side of the semi-reflecting layer 2, in the light emission region that reflects light of wavelength λ, be adjusted so that the following relationships are satisfied.

$$L = \Sigma d_i$$

$$\Sigma(n_i \cdot d_i) = m \cdot \lambda/2 \qquad \text{Eq. 2}$$

where, in Equation 2, ni is the refractive index of each layer existing between the reflecting surface on the negative electrode side of the reflecting layer 7 and the reflecting surface on the negative electrode side of the semi-reflecting layer 2, di is the thickness thereof, and m is a natural number.

The reflecting layer group 7 is positioned at the back surface of the negative electrode 5, configured with reflecting layers 7R, 7G, and 7B that respectively reflect light having specific wavelengths in the light that is emitted through the negative electrode 5 to the back surface laminated, ordered in a plane perpendicular to the light axis, in correspondence with the wavelength of the light to be reflected. The reflecting layer 7R is optimized so that it interferes with red wavelengths (near 625 nm). The reflecting layer 7G is optimized so that it interferes with green wavelengths (near 525 nm). And the reflecting layer 7B is optimized so that it interferes with blue wavelengths (near 450 nm).

In the reflecting layer group 7, the reflecting layer 7R that is resonant for light of longer wavelength (red light) is positioned closest to the negative electrode 5, while the reflecting layers 7G and 7B that are resonant for light of shorter wavelength (green and blue light) are arranged so that they line up in that order. Light of short wavelength is not easily reflected by semi-reflecting layers optimized for light of longer wavelength, wherefore an efficient reflecting mirror can be configured by ordering the layers in this fashion.

The reflecting layer group 7 in this embodiment is configured so that multiple types of reflecting layer are separated between light emission regions or defined specifically for each light emission region. This is done because light emitting layers corresponding to each, color are formed at different positions in order to adjust the light emission conditions on the front surface side in the light emitting layer 4. This is so because, since it is necessary to adjust the light emission conditions on the back surface side independently, as for the front surface side, the reflecting layer group 7 must be separated and moved according to light emission region. However, so long as the optical path length conditions can be satisfied, it is not absolutely necessary to form these separated. In other words, if the optical path length between the reflecting surfaces on the light emitting layer side in the reflecting layers in the reflecting layer group and the reflecting surfaces on the light emitting layer side in the semi-reflecting layers in the semi-reflecting layer group can be adjusted so that resonance can be achieved for wavelengths in any light emission region, it is possible to form the reflecting layers continuously in all of the light emission regions.

Figure 2:
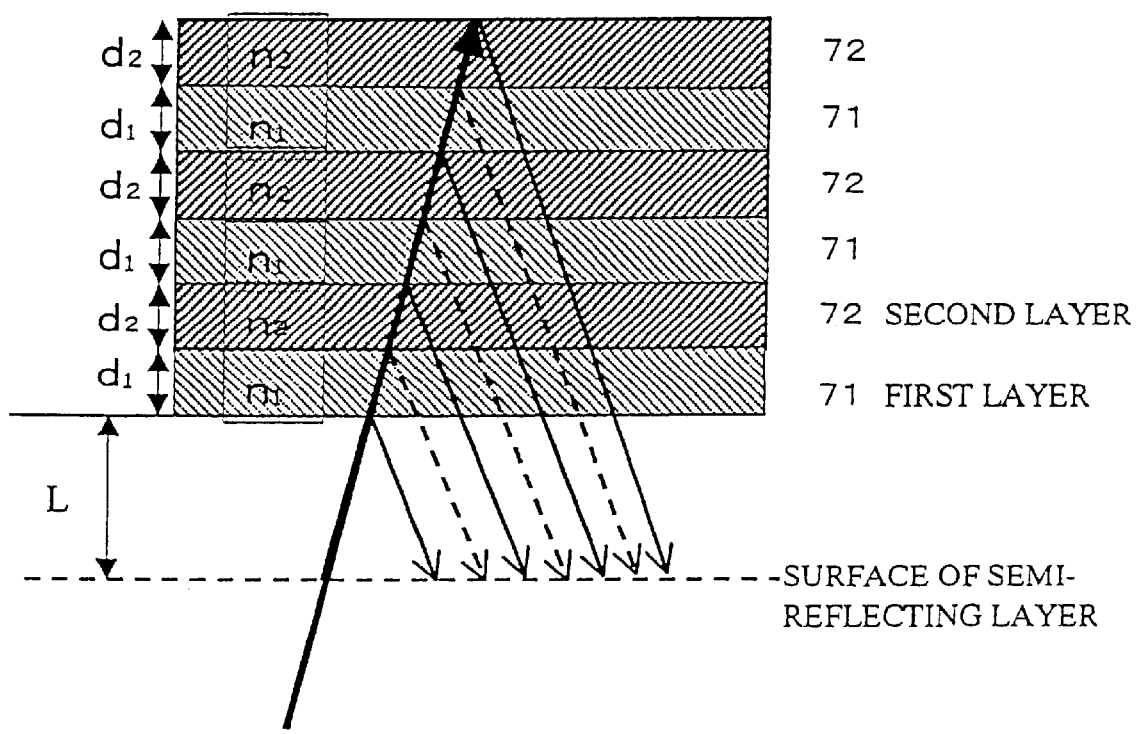
FIG. 2 is a diagram for explaining interference conditions in reflecting layers.

In FIG. 2 is given an enlarged diagram of the layer structure in the reflecting layers in the reflecting layer group 7 for explaining the interference conditions. Each reflecting layer is made by alternately stacking two layers having different refractive indexes, namely a first layer 71 and a second layer 72. In terms of the interference conditions for refractive index and thickness, adjustments are made so that the following relationship is satisfied.

$$n_1 \cdot d_1 \approx n_2 \cdot d_2 \approx (\tfrac{1}{4}+m/2) \cdot \lambda \qquad \text{Eq.3}$$

where $n_1$ is the refractive index for the first layer 71, $d_1$ is the thickness thereof, $n_2$ is the refractive index for the second layer 72, $d_2$ is the thickness thereof, λ is the wavelength of light reflected in that reflecting layer, and m is an integer 0 or greater. The thickness of the two layers corresponds to the half wavelength of light. Reflection occurs when light is transmitted from a layer of low refractive index to a layer of high refractive index, wherefore it is desirable that the arrangement be such that, beginning from the negative electrode side, there are a layer of high refractive index, a layer of low refractive index, a layer of high refractive index, and a layer of low refractive index, set such that $$n_1 > n_2.$$

In terms of specific materials for the reflecting layers 7R, 7G, and 7B, dielectric materials of different refractive indexes are stacked up so that the relationship in Equation 3 is satisfied. An example would be the use of $TiO_2$ having a refractive index of 2.4 for the first layer 71 and $SiO_2$ having a refractive index of 1.44 for the second layer 72. An alternative example would be the use of ZnS having a refractive index of 2.37 for the first layer 71 and $MgF_2$ having a refractive index of 1.38 for the second layer 72. The layers configuring the reflecting layers are not limited to dielectric substances, however, and may have a laminar structure made up of a resin and a liquid crystal as cited in Japanese Patent Application Laid-Open No. H10-133222/1998 (gazette). In the reflecting layers, the thicknesses of the first and second layers, respectively, are adjusted so as to agree with the wavelengths in those reflecting layers. When the difference in refractive index between the first and second layers is small, the reflectance will be low, so many layers are laminated.

There is no limitation on the configuration on the front surface side of the organic electro-luminescence light emitting device but, in this embodiment, a micro resonance structure is provided similar to the configuration on the back surface side.

The positive electrode 3 is provided so as to exhibit light transmissivity and to function as the positive electrode in the organic EL device, and the material used therefore is a metal, alloy, or electrically conductive compound having a large work function (4 eV or greater), or mixture thereof. ITO may be cited as preferable, and, if they are made thin enough to secure light transmissivity, other metals such as Au, or CuI, $SnO_2$, or ZnO, may be used.

The thickness of the positive electrode 3 is formed similarly with the resonance conditions adjusted in the gap adjustment layer 6 on the back surface side.

The semi-reflecting layer group 2 comprises the semi-reflecting layers 2R, 2G, and 2B. The configuration in each semi-reflecting layer 2R, 2G, and 2B may be considered to be like the configuration in the reflecting layers 7R, 7G, and 7B. In other words, they are configured with a first layer and a second layer of different refractive index alternately stacked up. However, the relative position of the light emitting layer 4 is reversed, wherefore the order of stacking is the reverse of that in the reflecting layer group 7.

The substrate 1 provides a base during fabrication. It is made of a material that exhibits light transmissivity and a certain degree of mechanical strength, environmental protection, and that can withstand heat treatment during fabrication. Glass, quartz, and resins are suitable for this material.

In the configuration described in the foregoing, the negative electrode 5 transmits a portion of the light ejected from the light emitting layer 4 to the back surface. The light that passes through the negative electrode 5 proceeds to the reflecting layer group 7. The gap adjustment layer 6 determines, for the light in each light emission region, the optical path length between the reflecting surface in the reflecting layer in the reflecting layer group and the reflecting surface in the semi-reflecting layer in the semi-reflecting layer group. The reflecting layer group 7 is made so that each of its reflecting layers 7R, 7G, and 7B, respectively, can reflect light of the corresponding color, and so that the resonance conditions between the reflecting surfaces are satisfied. In each light emission region, only light corresponding to that light emission region is reflected by the reflecting layer, whereupon that light passes again through the negative electrode 5 and reaches the light emitting layer 4. Some of the light that is ejected from the light emitting layer 4 to the front surface is reflected at the semi-reflecting layer in the semi-reflecting layer group and returned to the light emitting layer side. For this reason, light resonance occurs between the reflecting surfaces of the reflecting layers and the reflecting surfaces of the semi-reflecting layers. When the thickness of the negative electrode 5 is adjusted here so that phases of the light reflected from the front surface and of the light reflected from the back surface coincide, the light spectrum is sharpened by the resonance, and the light is intensified and ejected from the light emitting device to the outside.

In order to employ this multiple-wavelength light emitting device in an electronic apparatus, a drive circuit is configured and connected thereto so that control voltages can be applied independently, in light emission region units, across the positive electrode and the negative electrode. If the drive circuit is driven according to pixel on and off states for displaying image data and control voltages are applied accordingly to each light emission region, the light-emitting pixel (reflection) regions and the non-light-emitting pixel regions will fluctuate according to the image data, wherefore an overall color display can be effected.

As based on the first embodiment described in the foregoing, light leaking out to the back surface of the negative electrode is mutually intensified under optimum conditions between a reflecting layer on the back surface side and a semi-reflecting layer on the front surface side, thereby making it possible to provide a multiple-wavelength light emitting device exhibiting good light emission efficiency.

As based on this embodiment, furthermore, a reflecting layer optimized for light of long wavelength is provided, wherefore efficiency can be improved without affecting the light of other wavelengths.

As based on this embodiment, moreover, an organic EL device is used as the light emission means, wherefore it is possible to select from among a wealth of materials for material exhibiting suitable wavelength dispersion.

As based on this embodiment, furthermore, the light-emitting-material is changed among light emission regions, wherefore light of higher purity and greater intensity can be output.

As based on this embodiment, moreover, light is allowed to pass through the negative electrode, wherefore the range of selectable materials is broadened.

Embodiment 2

Figure 3:
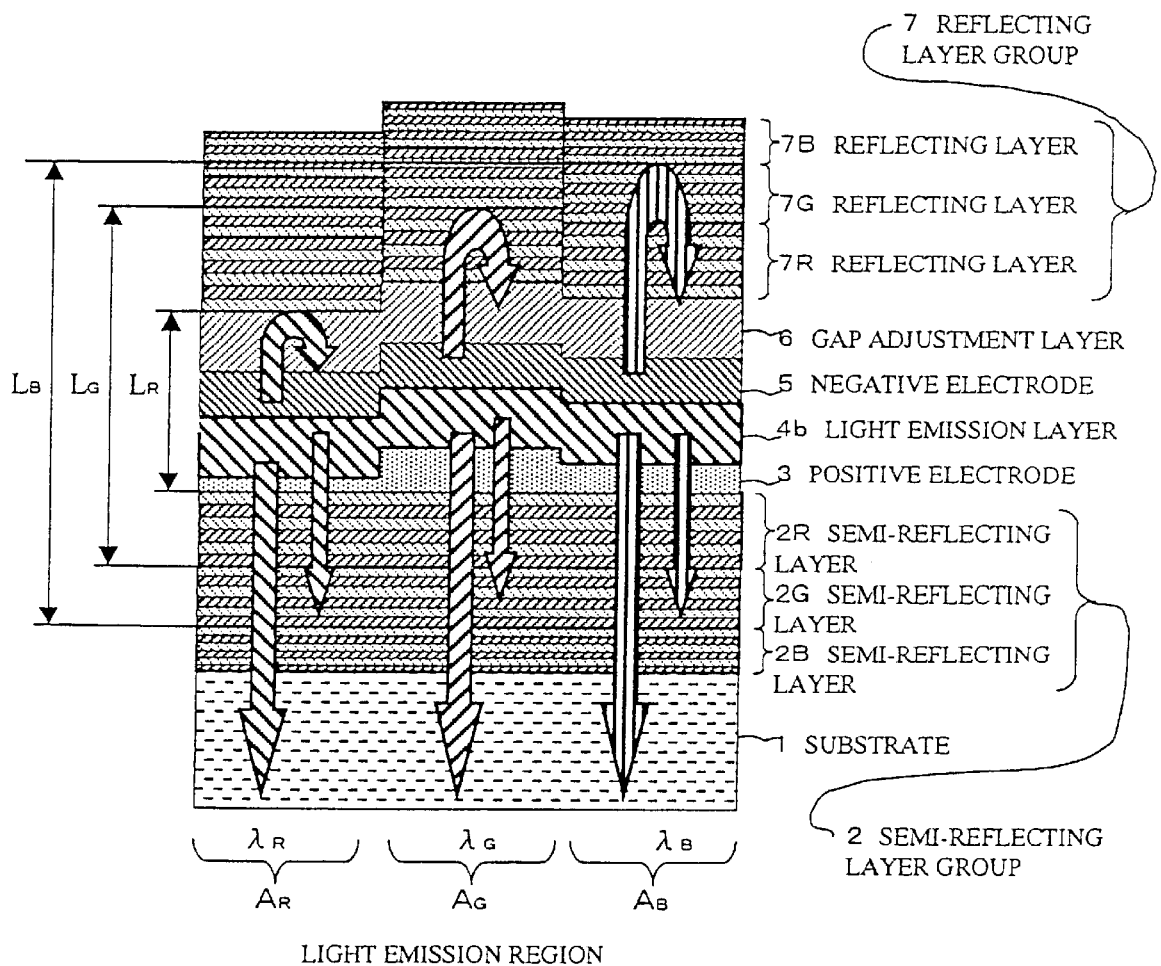
FIG. 3 is a cross-sectional diagram of the layer structure in a multiple-wavelength light emitting device in a second embodiment of the present invention.

In the first embodiment described in the foregoing, different light emitting layers are provided for each light emission region. In a second embodiment, a common light emitting layer is provided for all of the light emission regions. In FIG. 3 is diagrammed the layer structure of the multiple-wavelength light emitting device in the second embodiment. This multiple-wavelength light emitting device, as diagrammed in FIG. 3, comprises a substrate 1, a semi-reflecting layer group 2, a positive electrode 3, a light emitting layer 4b, a negative electrode 5, a gap adjustment layer 6, and a reflecting layer group 7.

The characteristic feature of this embodiment is that a light emitting layer 4b is provided in common for all of the light emitting regions. As the material for such a light emitting layer 4b, it is preferable to use a broad spectral-range light emitting material containing the wavelength components of the light supplied from each light emission region in good balance. Such materials that can be used include aluminum chelate ($Alq_3$), and polyparaphenylene vinylene, etc.

The other configurational aspects and optical conditions may be considered to be the same as in the first embodiment already described. In cases where the electric charge carrying capability of the light emitting layer is poor, it is permissible to incorporate a hole injection layer or a hole transport layer and/or an electron transport layer as in an embodiment described subsequently.

In the configuration described above, light containing all of the wavelength components to be output is ejected to the back surface. In the reflecting layer group 7, at each reflecting layer is reflected light having a wavelength optimized to that reflecting layer. However, the distance between the reflecting surface on the light emitting layer side of the semi-reflecting layer and the reflecting surface in each reflecting layer is optimized so as to coincide with resonance conditions only for light of one light emission region, wherefore only light having a wavelength coinciding with those resonance conditions will have its spectrum sharpened and be reflected.

As based on the second embodiment described above, while displaying the same effectiveness as in the first embodiment described earlier, it is not necessary to fabricate light emitting layers separately for each light emission region, wherefore fabrication is simplified.

Embodiment 3

A third embodiment of the present invention relates to a configuration wherein an electron transport layer is added to the organic EL device of the embodiments described earlier.

Figure 4:
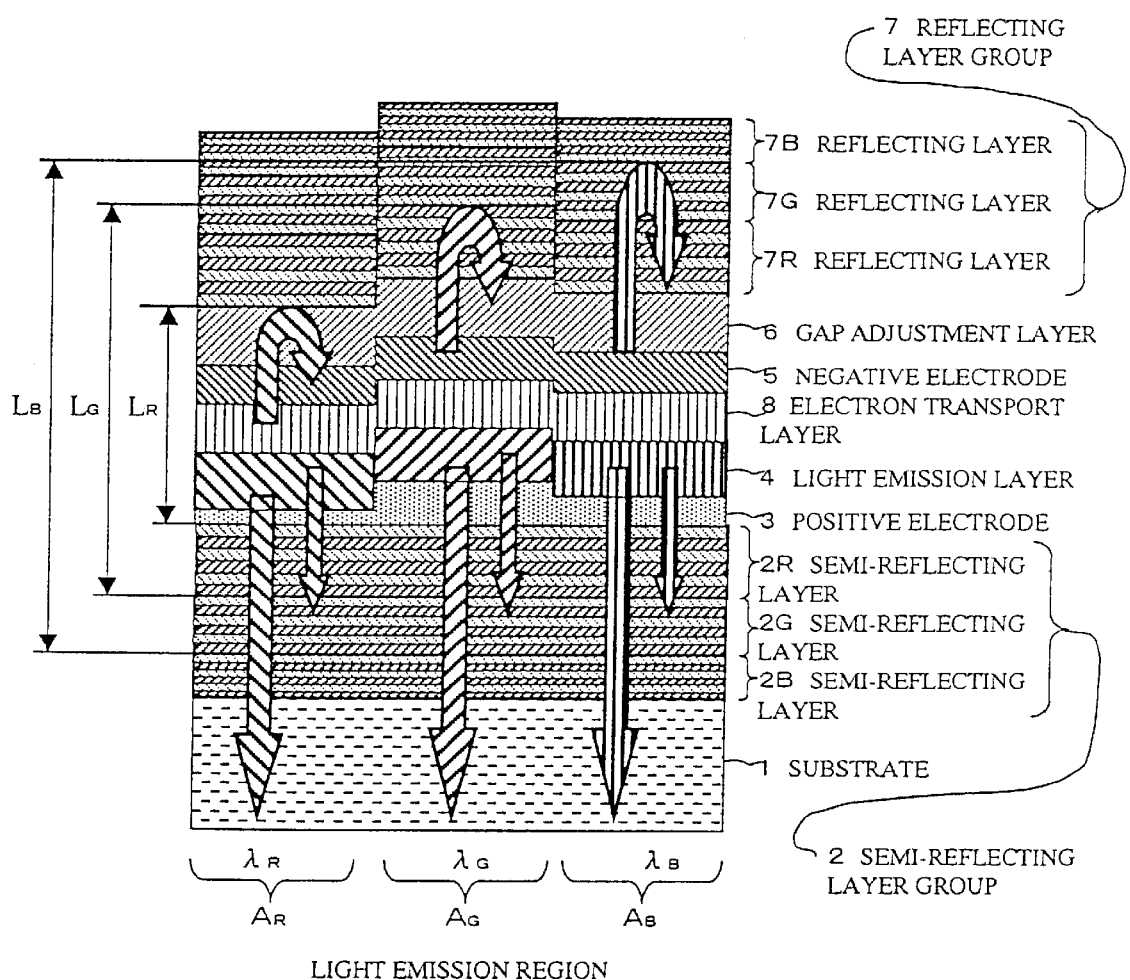
FIG. 4 is a cross-sectional diagram of the layer structure in a multiple-wavelength light emitting device in a third embodiment of the present invention.

In FIG. 4 is diagrammed a layer structure of the multiple-wavelength light emitting device in the third embodiment. This multiple-wavelength light emitting device, as diagrammed in FIG. 4, comprises a substrate 1, a semi-reflecting layer group 2, a positive electrode 3, a light emitting layer 4, an electron transport layer 8, a negative electrode 5, a gap adjustment layer 6, and a reflecting layer group 7.

The electron transport layer 8, also called an electron injection layer, exhibits the function of efficiently transferring electrons injected from the negative electrode to the light emitting layer. For this electron transport layer it is possible to use the materials cited in either Japanese Patent Application Laid-Open No. H10-163967/1998, H8-248276/1996, or S59-194393/1984. More specifically, it is possible to use a nitro-substitution fluorene derivative, an anthraquino-dimethane derivate, a difenyl quinone derivative, a thiopyrane-dioxide derivative, a heterocyclic tetracarboxylic acid anhydride such as naphthalene perilene, carbodiimide, a freoledine methane derivative, a derivative of anthraquino-dimethane and anthrone, an oxadiazole derivative, or a quinoxaline derivative. The thickness thereof is made sufficient to exhibit an electron carrying function.

The electron transport layer may be present or absent, and whether or not to provide it may be determined in conjunction with the organic EL material.

A hole transport layer may be provided between the light emitting layer 4 and the positive electrode 3. For the hole transport layer is used either an organic or inorganic substance that exhibits a hole injection function and/or an electron obstructing function. Those substances cited in Japanese Patent Application Laid-Open No. H10-163967/1998 or No. H8-248276/1996 can be used for this purpose.

The layer structure otherwise is the same as in the first embodiment described earlier and so is not further described here.

As based on the third embodiment described above, while displaying the same effectiveness as in the first embodiment described earlier, an electron transport layer is provided, wherefore the light emission efficiency of the organic EL device is enhanced, making it possible to produce a light emitting device that is even brighter.

Embodiment 4

Figure 5:
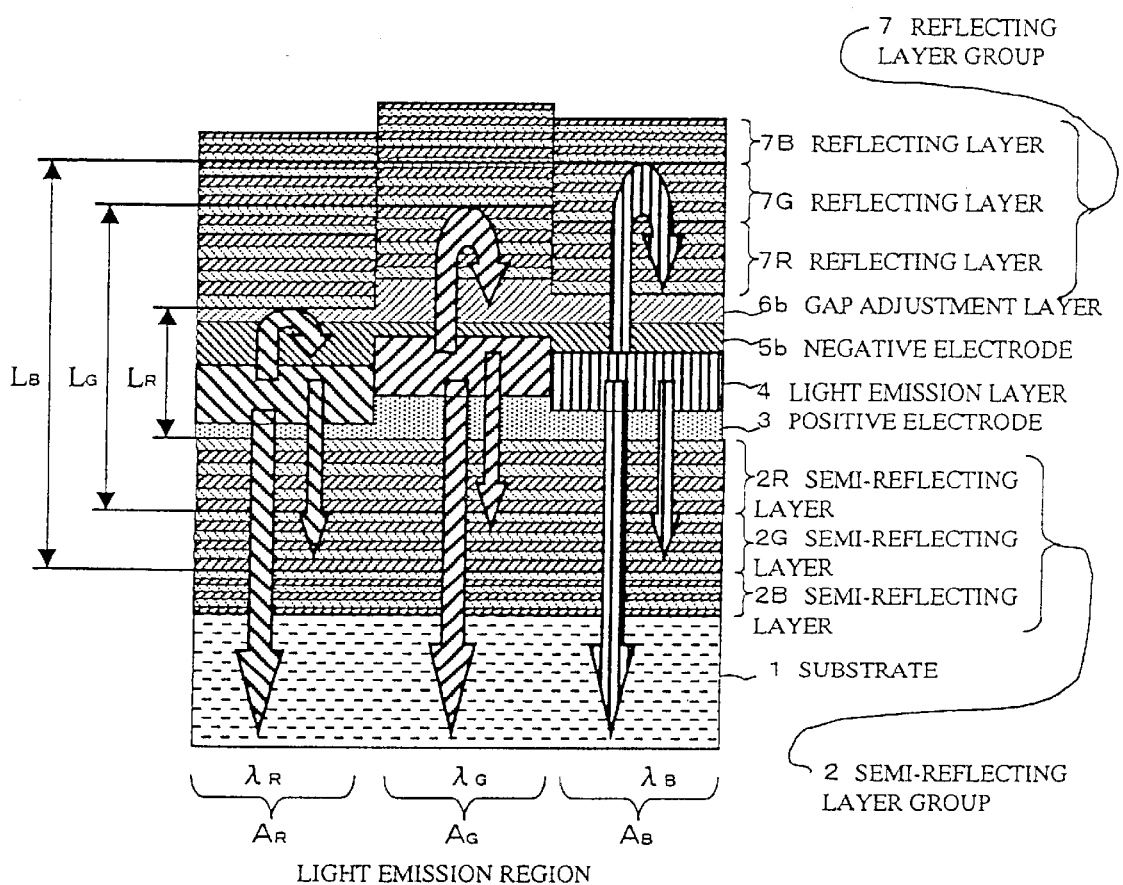
FIG. 5 is a cross-sectional diagram of the layer structure in a multiple-wavelength light emitting device in a fourth embodiment of the present invention.

A fourth embodiment of the present invention relates to a configuration wherein the thickness of the negative electrode is changed for each light emission region. The layer structure of the multiple-wavelength light emitting device that is the fourth embodiment is diagrammed in FIG. 5. This multiple-wavelength light emitting device, as diagrammed in FIG. 5, comprises a substrate 1, a semi-reflecting layer group 2, a positive electrode 3, a light emitting layer 4, a negative electrode 5b, a gap adjustment layer 6b, and a reflecting layer group 7.

The negative electrode 5b differs from the negative electrode 5 in the first embodiment in that the thickness thereof is adjusted so that the surface on the reflecting layer group 7 side is in the same plane in all light emission regions. The gap adjustment layer 6b differs in that the thickness thereof has been changed from that of the gap adjustment layer 6 in the first embodiment in order to match the resonance conditions in each light emission region, due to the fact that the position of the surface on the reflecting layer group 7 side in the negative electrode 5b has changed. The configuration in other respects is the same as in the embodiments described in the foregoing. As in the second and third embodiments described earlier, a hole transport layer and/or an electron transport layer may be provided, and the light emitting layer may be made common for all of the light emission regions.

As based on the fourth embodiment described above, the surface of the negative electrode 5b on the reflecting layer group 7 side is formed in one plane, thus affording the advantage of making fabrication of both the gap adjustment layer 6b and the reflecting layer group 7 easier.

Embodiment 5

In the embodiments described in the foregoing, the resonance conditions are established by making the thickness of the gap adjustment layer different for each light emission region. In a fifth embodiment, the resonance conditions are altered while keeping the thickness of each layer uniform.

Figure 6:
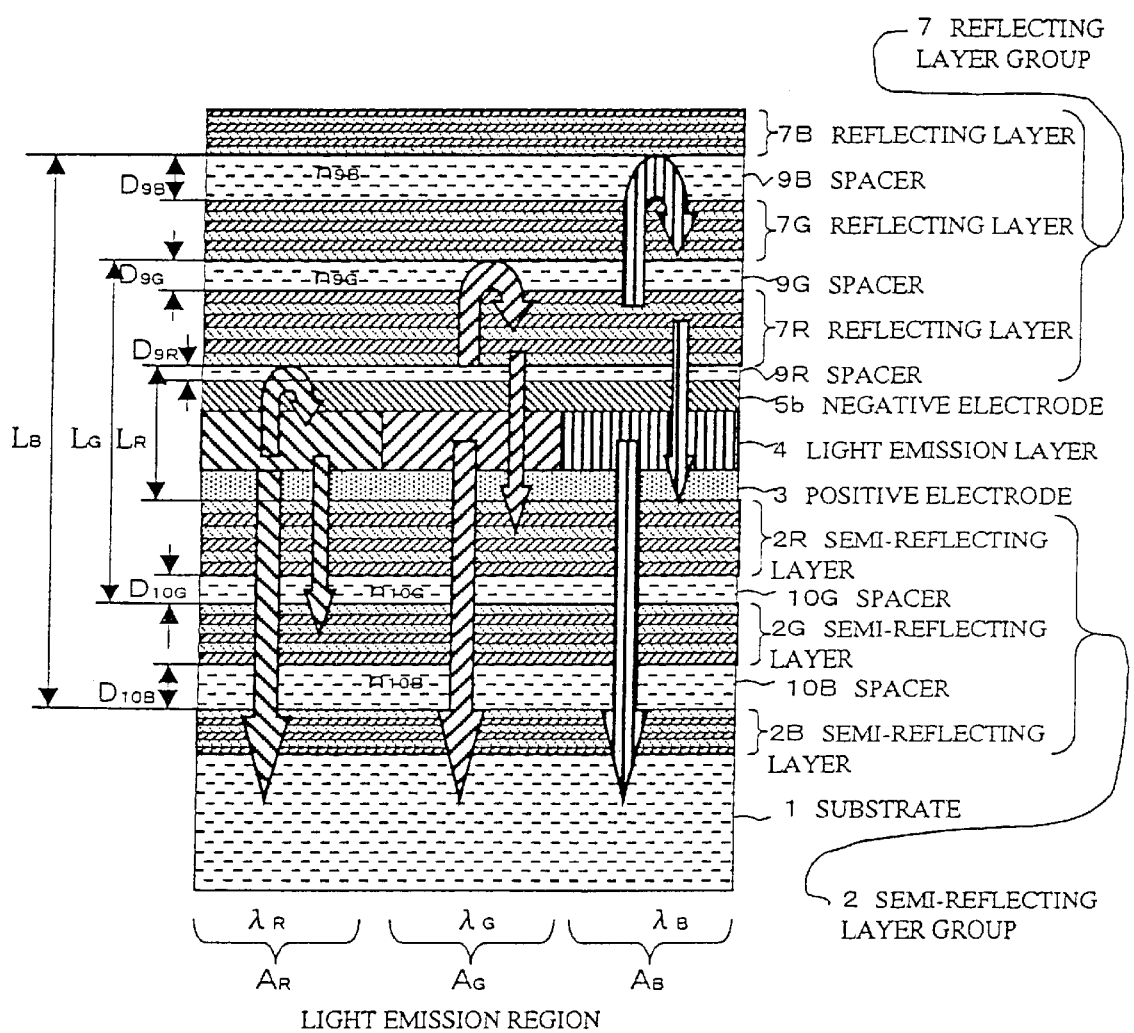
FIG. 6 is a cross-sectional diagram of the layer structure in a multiple-wavelength light emitting device in a fifth embodiment of the present invention.

In FIG. 6 is diagrammed the layer structure for the multiple-wavelength light emitting device in the fifth embodiment. This multiple-wavelength light emitting device comprises, as diagrammed in FIG. 6, a substrate 1, a semi-reflecting layer group 2, a positive electrode 3, a light emitting layer 4, a negative electrode 5b, and reflecting layers 7R, 7G, and 7B provided with spacers 9R, 9G, and 9B, respectively. The characteristic feature of the multiple-wavelength light emitting device in this embodiment is that the reflecting layers are uniformly across all of the light emission region.

The positive electrode 3, light emitting layer 4, and negative electrode 5 are all formed with a uniform thickness across the light emission regions.

The semi-reflecting layer group 2 comprises spacers 10B and 10G between the semi-reflecting layers. The spacer particulars may be considered to be the same as for the spacers 9G and 9B described below.

The materials for the light emitting layer 4 are selected, respectively, so that they contain large amounts, respectively, of red light wavelength components in the light emitting layer 4R in the red light emission region $A_R$, of green light wavelength components in the light emitting layer 4G in the green light emission region $A_G$, and of blue light wavelength components in the light emitting layer 4B in the blue light emission region $A_B$, while containing comparatively small amounts of other wavelength components therein. That is because, in this embodiment, the layer structure is the same for every light emission region, wherefore it is necessary to specify the light emission wavelength with the characteristics of the light emitting layer itself.

The negative electrode 5b is adjusted, as in the fourth embodiment, so that the surface on the reflecting layer group side is in the same plane in all light emission regions. This is made an even surface in order to facilitate fabrication of the laminar structure on the back surface side.

The spacer 9R is a layer the thickness whereof is set to be even in all light emission regions. It is a layer for adjusting the gap in the red light emission region so as to satisfy the resonance conditions. The spacers 9G, 9B, 10B, and 10G are layers for adjusting the gap between the reflecting layer layers so that the resonance conditions are satisfied in the other light emission regions.

The material used for the spacers should be a material that exhibits high light transmissivity and that bonds well with the semi-reflecting layers, such, for example, as a resin or a dielectric. If it is possible to maintain the distance between the semi-reflecting layers, then of course this layer may even be made of a gas, liquid, or liquid crystal. The materials used in the spacers 9G, 9B, 10B, and 10G may also be made different so that the refractive indexes thereof are different.

The thicknesses of the spacers 9R, 9G, 9B, 10B, and 10G are set so as to match the resonance conditions described for the first embodiment. More specifically, for the red light emission region $A_R$, the optical path length $L_R$ between the reflecting surface in the reflecting layer 7R and the reflecting surface on the light emitting layer side of the semi-reflecting layer 2R is maintained so as to correspond with a natural number multiple of the half wavelength of the light (red light) reflected in that reflecting layer 7R. In Equation 2 given above, which represents the resonance conditions, to the optical path length when there is no spacer is added an optical path distance corresponding to the product of the refractive index $n_{9R}$ of the spacer 9R and the thickness $D_{9R}$ thereof (i.e. $n_{9R} \cdot D_{9R}$). For the green light emission region $A_G$, the sum of the optical path distance corresponding to the product of the spacer 9G refractive index $n_{9G}$ and the thickness thereof $D_{9G}$, the optical path distance corresponding to the product of the spacer 10G refractive index $n_{10G}$ and the thickness thereof $D_{10G}$, and the optical path distance in the spacer 9R (i.e. $n_{9R} \cdot D_{9R} + n_{9G} \cdot D_{9G} + n_{10G} \cdot D_{10G}$) is added to the optical path length when there is no spacer, and the thickness thus set so as to satisfy the resonance conditions represented by Equation 2. For the blue light emission region $A_B$, the optical path lengths for the spacers 9R, 9G, 9B, 10G, and 10B (i.e. $n_{9R} \cdot D_{9R} + n_{9G} \cdot D_{9G} + n_{9B} \cdot D_{9B} + n_{10G} \cdot D_{10G} + n_{10B} \cdot D_{10B}$) are added to the optical path length when there is no spacer, and the thickness thus set so as to satisfy the resonance conditions in Equation 2.

In cases where the electrical charge carrying capacity of the light emitting layer is low, moreover, either a hole transport layer or an electron transport layer, or both, may be provided.

In the configuration described in the foregoing, the light from the light emitting layer passes through the negative electrode 5b and is also ejected to the back surface, whereupon red light resonates as in the first embodiment between the reflecting surface of the red reflecting layer 7R closest to the light emitting layer and the reflecting surface with the red semi-reflecting layer 2R on the front surface side and is reflected efficiently. In the other light emission regions also, the optical path length between the reflecting layers and the semi-reflecting layers is adjusted to coincide with a natural number multiple of the half wavelength, wherefore resonance occurs for the light of those respective wavelengths, and the resonant wavelength spectrums are sharpened and reflected efficiently.

As based on the fifth embodiment described in the foregoing, while displaying the same effectiveness as in the first embodiment described earlier, both the spacers and the reflecting layers need only be formed with a flat, even thickness, wherefore such complex process steps as patterning can be omitted and fabrication costs lowered.

Embodiment 6

Figure 7:
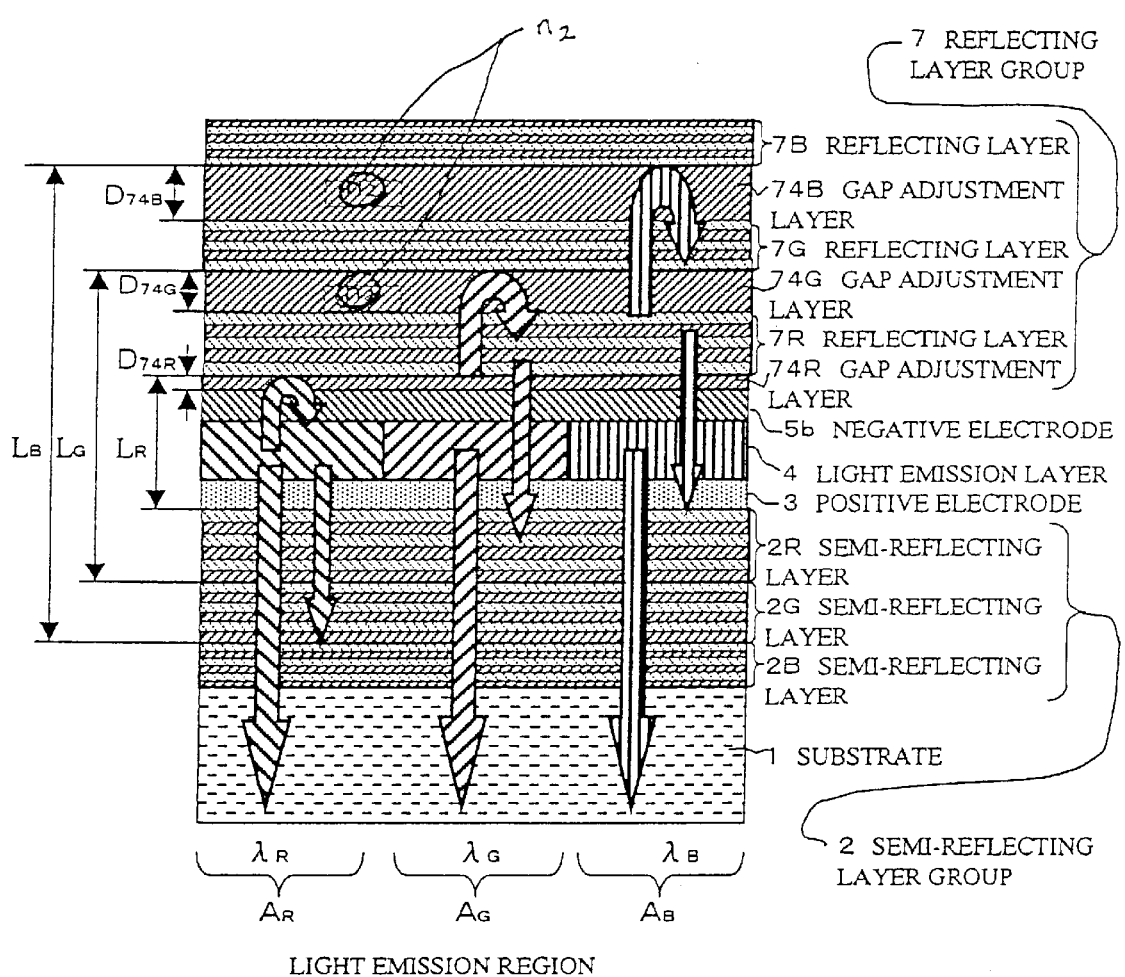
FIG. 7 is a cross-sectional diagram of the layer structure in a multiple-wavelength light emitting device in a sixth embodiment of the present invention.

A sixth embodiment relates to a modification of the gap adjustment method employed in the fifth embodiment. In FIG. 7 is diagrammed the layer structure of the multiple-wavelength light emitting device in the sixth embodiment.

This multiple-wavelength light emitting device comprises, as diagrammed in FIG. 7, a substrate 1, a semi-reflecting layer group 2, a positive electrode 3, a light emitting layer 4, a negative electrode 5b, and reflecting layers 7R, 7G, and 7B in contact with the gap adjustment layer 74R and the gap adjustment layer 74G and the gap adjustment layer 74B. The characteristic feature of the multiple-wavelength light emitting device in this embodiment is that the reflecting layers are positioned uniformly without being separated between the light emitting regions, as in the fifth embodiment.

The positive electrode 3, light emitting layer 4, and negative electrode 5 are formed of uniform thickness across all of the light emission regions.

The gap adjustment layer 74R can be considered to be the same as the gap adjustment layer 6 described earlier. However, it is possible to use the second layer 72 having lower refractive index in the red reflecting layer 7R as the gap adjustment layer 74R. The gap adjustment layer 74G is a layer for adjusting the gap between the reflecting layers, in a configuration wherein the thickness of the second layer 72 having a low refractive index closest to the reflecting layer 7G, of the red light reflecting layer 7R, has been altered. The gap adjustment layer 74B is a layer for adjusting the gap between the reflecting layers, in a configuration wherein the thickness of the second layer 72 having a low refractive index closest to the reflecting layer 7B, of the green light reflecting layer 7G, has been altered.

Because the layers comprising the reflecting layers are themselves dielectric materials, if the thickness of one layer thereof is made different, that layer will cease to be a layer that contributes to light interference, and will contribute to increasing the optical path length provided by the refractive index and thickness thereof.

The thickness of the gap adjustment layer 74G, for green light, is set so that the optical path length corresponding to the product of the refractive index (given as $n_2$) of the gap adjustment layer 74R and the thickness $D_{74R}$ thereof and the optical path length corresponding to the product of the refractive index $n_2$ of the gap adjustment layer 74G and the thickness $D_{74G}$ thereof satisfy the resonance conditions considered in Equation 2. The thickness of the gap adjustment layer 74B, for blue light, is set so that the optical path length $n_2 \cdot (D_{74R} + D_{74G} + D_{74B})$ resulting from the gap adjustment layers 74R, 74B, and 74G also satisfies the resonance conditions considered in Equation 2.

Furthermore, in the semi-reflecting layer-group 2 also, as in the reflecting layer group 7, it is possible to use some of the layers configuring the semi-reflecting layers 2R, 2G, and 2B as gap adjustment layers, adjusting the optical path lengths and setting [them] so that the resonance conditions are satisfied.

Otherwise the configuration is the same as that in the fifth embodiment described earlier.

As based on the sixth embodiment described in the foregoing, gaps are adjusted with layers at the boundaries of the reflecting layers, wherefore the number of materials used can be reduced, so that, when forming the gap adjustment layers in the reflecting layer fabrication processes, only film thickness control need be implemented, making it possible to reduce the number of fabrication steps.

Embodiment 7

Figure 8:
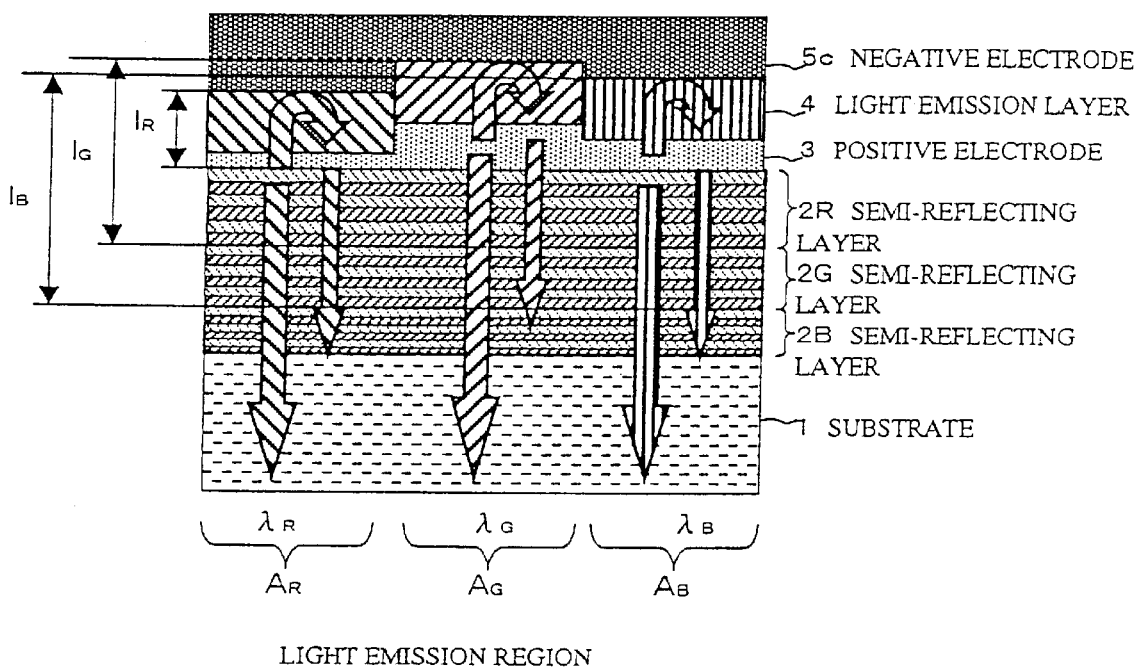
FIG. 8 is a cross-sectional diagram of the layer structure in a multiple-wavelength light emitting device in a seventh embodiment of the present invention.
Figure 9:
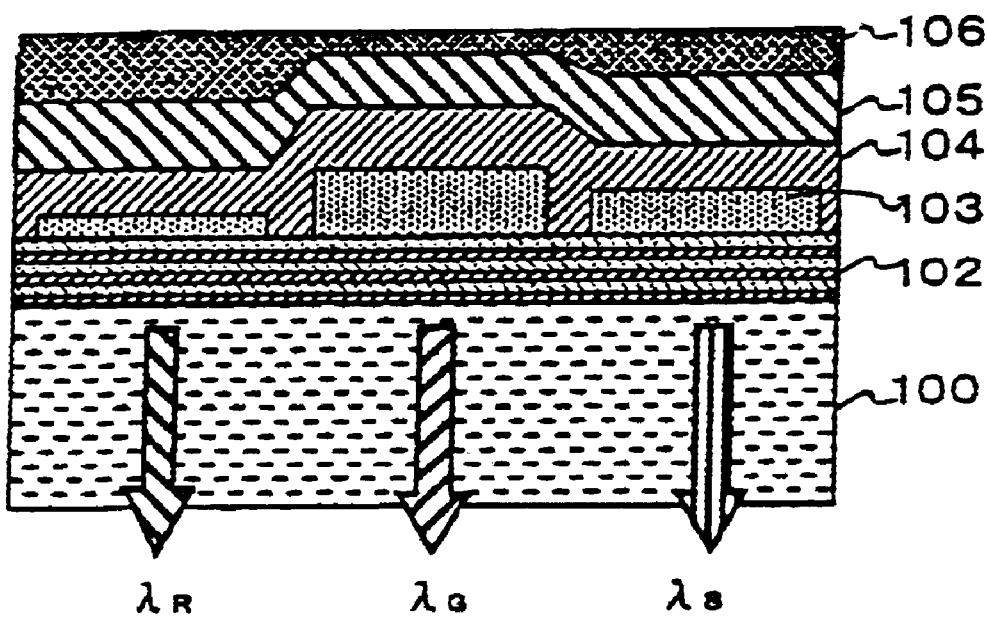
FIG. 9 is a cross-sectional diagram of the layer structure in a conventional light emitting device.

A seventh embodiment relates to a light emitting device wherein the reflectance of the negative electrode itself is enhanced. In FIG. 8 is diagrammed the layer structure of the multiple-wavelength light emitting device in the seventh embodiment. This multiple-wavelength light emitting device, as diagrammed in FIG. 8, comprises a substrate 1, a semi-reflecting layer group 2, a positive electrode 3, a light emitting layer 4, and a negative electrode 5c.

The negative electrode 5c, while exhibiting a work function such that it can be used as the negative electrode in an organic electro-luminescence device, is made of a material that also exhibits high reflectance. This material may be selected from among diamond, boron nitride, and aluminum nitride.

As methods of fabricating a diamond negative electrode, there are methods for growing a carbon crystalline structure such as a plasma CVD method and hot-filament CVD method. It is possible, for example, to form diamond thin films by chemical-vapor-phase growing carbon crystals from a gas mixture of $CH_4+H_2$ in an atmosphere at 0.1 Torr and several hundred degrees.

For boron nitride or aluminum nitride negative electrodes, it is possible to employ a plasma CVD method capable of forming nitrides by the CVD method.

As based on this seventh embodiment, the material of which the negative electrode is made, while exhibiting a low energy level and thus capable of being used as the negative electrode in a electro-luminescence device, also exhibits high reflectance, making it possible to improve the light utilization factor.

Other Modifications

The present invention is not limited to or by the embodiments described in the foregoing but can be configured with suitable modifications so long as the main concept thereof is retained. The reflecting layers based on multi-layer dielectric materials, for example, are only employed herein as representative reflecting means capable of thin-film formation; any known thin film having a reflecting function but some other structure may be used instead.

In the embodiments described in the foregoing, multi-layer dielectric films are used for the reflecting layers, but this is not a limitation. It is permissible, for example, to employ optical elements functioning as half mirrors or thin films, installing them so as to satisfy the resonance conditions, or to employ polarizing panels as the reflecting layers, controlling the light polarizing conditions.

The light emission means are not limited to an organic electro-luminescence device either, but may be some other light emission means based on another light emission effect.

There is no limitation on the electronic apparatus in which it is possible to employ the multiple-wavelength light emitting device of the present invention. It can be used in display devices or illumination devices in watches, calculators, portable telephones, pagers, electronic notebooks, notebook PCs, and other portable information terminal devices, and also in camera viewfinders and large displays.

As based on the present invention, multiple-wavelength light emitting devices can be provided which can emit light in a plurality of wavelengths with higher efficiency than conventionally because the structure thereof makes it possible to reflect light that leaks out to the back surface back to the front surface under ideal conditions.

As based on the present invention, multiple-wavelength light emitting devices can be provided which exhibit a higher. efficiency for a plurality of wavelengths more efficiently than conventionally, because under the ideal conditions, the structure thereof makes it possible to light leaks out to the back surface towards front surface.

As based on the present invention, it is possible to provide electronic apparatus capable of brighter displays than conventionally because they comprise multiple-wavelength light emitting devices that emit light in a plurality of wavelengths with higher efficiency than conventionally.

What is claimed is:

1. A multiple-wavelength light emitting device for emitting light in a plurality of different wavelengths, comprising:
    light emission means for emitting light containing wavelength components to be output;
    a semi-transparent layer that transmits at least a portion of said light, placed at the back surface of said light emission means;
    a reflecting layer group provided on a first surface side of said light emission means, with said semi-transparent layer intervening, wherein reflecting layers that reflect light have specific wavelengths of light ejected to said first surface side from said light emission means via said semi-transparent layer are laminated in order in the direction of light axis in correspondence with wavelengths of light to be output; and
    a semi-reflecting layer group, provided on a second surface side in opposition to said first surface of said light emission means, formed by laminating multiple types of semi-reflecting layers each laver corresponding to a different wavelengths of reflected light out of multiple different wavelengths, wherein semi-reflecting layers that reflect a portion of light having specific wavelengths of light ejected to said second surface side from said light emission means and transmit the remainder thereof are laminated in order in the direction of said light axis in correspondence with wavelengths of light to be output; wherein:
        in two or more light emission regions wherein output light wavelength differs, the distance between the reflecting surface for light from said light emission means in a reflecting layer in said reflecting layer group that reflects light of wavelength output in that light emission region and the reflecting surface for light from said light emission means in a semi-reflecting reflecting layer in said semi-reflecting layer group that reflects a portion of light of wavelength output in that light emission region is adjusted so that it becomes a resonating optical path length for light ejected from that light emission region.

2. The multiple-wavelength light emitting device according to claim 1, wherein the thickness of said semi-transparent layers is adjusted so that the phase of light that, after being reflected by said reflecting layer group, again passes through that semi-transparent layer and is ejected to said second surface side of said light emission means coincides with the phase of light that is directly ejected to said second surface side of said light emission means.

3. The multiple-wavelength light emitting device according to claim 2, wherein a relational adjustment is made so that is satisfied, where, in a light emission region wherein light of wavelength λ is ejected, ni is the refractive index in each layer that exists between the point of light emission in said light emission means and the light reflecting surface of the light reflecting layer for light of wavelength λ in said light reflecting layer group, di is the thickness thereof, and m is a natural number.

4. The multiple-wavelength light emitting device according to claim 1, wherein a gap adjusting layer is provided between said semi-transparent layer and said reflecting layer group for adjusting the distance between the reflecting surface for light from said light emission means in said light reflecting layers and the reflecting surface for light from said light emission means in said semi-reflecting layers.

5. The multiple-wavelength light emitting device according to claim 1, wherein said reflecting layer group is configured with multiple types of reflecting layer corresponding to wavelengths of multiple kinds of light of different wavelength separated between said light emission regions.

6. The multiple-wavelength light emitting device according to claim 1, wherein reflecting surfaces for light from said light emission means in said reflecting layers in said reflecting layer group are located at different positions in the thickness dimension for each light emission region.

7. The multiple-wavelength light emitting device according to claim 1, wherein, in a light emission region where light of wavelength λ is ejected, the distance L between a reflecting surface for light from said light emission means in the reflecting layer that outputs light of wavelength λ and the reflecting surface for light from said light emission means in said semi-reflecting layer is relationally adjusted so that $L=\Sigma di$ $\Sigma(ni \cdot di)=m \cdot \lambda/2$ are satisfied, where ni is the refractive index of the i'th substance between these reflecting surfaces, di is the thickness thereof, and m is a natural number.

8. The multiple-wavelength light emitting device according to claim 1, wherein, in said reflecting layer group, reflecting layers reflecting light of longer wavelength are placed on said light emission means side.

9. The multiple-wavelength light emitting device according to claim 1, wherein reflective layers making up said reflecting layer group are configured so that two layers of different refractive index are alternately stacked up.

10. The multiple-wavelength light emitting device according to claim 9, wherein said reflecting layers are adjusted so that the relationship $n1 \cdot d1 \approx n2 \cdot d2 \approx (1/4+m/2) \cdot \lambda$ is satisfied, where n1 is the refractive index of one layer of said two layers having differing refractive indexes, d1 is the thickness thereof, n2 is the refractive index of other layer, d2 is the thickness thereof, λ is the wavelength of light reflected in that reflecting layer, and m is 0 or a natural number.

11. The multiple-wavelength light emitting device according to claim 1, wherein surfaces on said reflecting layer group side of said semi-transparent layers are formed so that they are in the same plane in all light emission regions.

12. The multiple-wavelength light emitting device according to claim 1, wherein said reflecting layer group is such that multiple types of reflecting layers corresponding to wavelengths of light of multiple different wavelengths are laminated uniformly without being separated between light emission regions.

13. The multiple-wavelength light emitting device according to claim 1, wherein said reflecting layer group is such that spacers are provided between said reflecting layers for adjusting the optical path length between the reflecting surface for light from said light emission means in said reflecting layer and the reflecting surface for light from said light emission means in said semi-reflecting layer.

14. The multiple-wavelength light emitting device according to claim 9, wherein said reflecting layer group is such that, in order to adjust the optical path length from the reflecting surface for light from said light emission means in said reflecting layers to the reflecting surface for light on said light emission means side in said semi-reflecting layers, the thickness of any one layer in the laminar structure of layers having different refractive indexes configuring said reflecting layers is altered.

15. The multiple-wavelength light emitting device according to claim 1, wherein a plurality of types of light emission means for emitting relatively many light components having wavelengths associated with said light emission regions are provided so as to correspond with said light emission regions.

16. The multiple-wavelength light emitting device according to claim 1, wherein light emission means capable of emitting light having wavelength components associated with all of said light emission regions is provided in common for said light emission regions.

17. The multiple-wavelength light emitting device according to claim 1, wherein said light emission means are an organic electro-luminescence layer sandwiched between electrodes, with the electrode provided at the first surface thereof being made said semi-transparent layer.

18. The multiple-wavelength light emitting device according to claim 17, wherein said light emission means comprise an electron transport layer and/or a hole transport layer.

19. An electronic apparatus comprising a multiple-wavelength light emitting device cited in claim 1.

20. A multiple-wavelength light emitting device for emitting a plurality of light types having different wavelengths, comprising:

an organic electro-luminescence layer for emitting light containing wavelength components to be output;

an electrode for reflecting light ejected to a first surface of said organic electro-luminescence layer, positioned at said first surface of said organic electro-luminescence layer; wherein:

said electrode is configured of one substance selected from a group made up of diamond, boron nitride, and aluminum nitride; and a semi-reflecting layer group formed by laminating multiple types of semi-reflecting layers, each layer corresponding to a different wavelengths of reflected light out of multiple different wavelengths.

* * * * *